United States Patent [19]
Lewis

[11] Patent Number: 5,136,261
[45] Date of Patent: Aug. 4, 1992

[54] SATURATED ABSORPTION DOUBLE RESONANCE SYSTEM AND APPARATUS

[75] Inventor: Lindon Lewis, Boulder, Colo.
[73] Assignee: Ball Corporation, Muncie, Ind.
[21] Appl. No.: 625,445
[22] Filed: Dec. 11, 1990
[51] Int. Cl.[5] .......................................... H03B 17/00
[52] U.S. Cl. .................................. 331/94.1; 356/349
[58] Field of Search ..................... 331/94.1, 1 R, 3; 356/349

[56] References Cited

U.S. PATENT DOCUMENTS

| | | | |
|---|---|---|---|
| 3,397,310 | 8/1968 | Holloway et al. | 331/3 |
| 3,403,349 | 9/1968 | Wieder | 331/94.1 |
| 3,536,993 | 10/1970 | Brun | 324/305 |
| 3,577,069 | 5/1971 | Malnar et al. | 331/94.1 |
| 3,718,868 | 2/1973 | Pao et al. | 372/32 |
| 3,967,115 | 6/1976 | Kern | 331/3 |
| 4,059,813 | 11/1977 | Leiby, Jr. et al. | 331/94.1 |
| 4,354,108 | 10/1982 | Toyama et al. | 331/94.1 |
| 4,425,653 | 1/1984 | Cutler | 372/70 |
| 4,596,962 | 6/1986 | Robinson | 331/3 |
| 4,684,900 | 8/1987 | Avila et al. | 331/94.1 |
| 4,814,728 | 3/1989 | Strayer et al. | 331/94.1 |

*Primary Examiner*—Robert J. Pascal
*Attorney, Agent, or Firm*—Gilbert E. Alberding

[57] ABSTRACT

A new detection method and system uses saturated optical absorption, double resonance of a narrow velocity class of atoms, such as cesium, to provide substantially improved frequency standards and physics packages. Such systems and standards are provided with a closed, at least partially transparent, cell of atoms of an alkali element such as cesium, without buffer gases, that are excited by laser light travelling through the atoms in counter-propagating directions at a frequency selected to correspond to the average of two optical frequencies selected to change the narrow velocity class of atoms from a first energy level to a second energy level and from the first energy level to a third energy level.

33 Claims, 5 Drawing Sheets

# SATURATED ABSORPTION DOUBLE RESONANCE SYSTEM AND APPARATUS

FIELD OF THE INVENTION

The present invention relates generally to atomic microwave spectroscopy, and to methods and apparatus using optical absorption resonance in detection systems and, more particularly, to a frequency standard that uses the microwave resonance of a narrow velocity class of atoms to maintain a stable frequency, with improved freedom from short-term and long-term instabilities and frequency variations due to changes in the environment of the standard.

BACKGROUND ART

Atomic frequency standards generate and maintain a standard frequency output by using the transition between two well-defined energy levels of an atom and the associated constant frequency to control the frequency of a frequency generating means. The atomic transition between two energy levels is employed as a highly stable frequency reference to which the frequency of a variable frequency oscillator, such as a voltage controlled oscillator (VCO) can be electronically locked. The high stability and relative insensitivity to environmental perturbations associated with an atomic reference frequency is transferred to the variable frequency oscillator.

Hydrogen, cesium and rubidium frequency standards have been used to provide atomic controlled oscillators in which the generated standard frequency is usually 5 megahertz (MHz) or 10 MHz. Such frequency standards have usually employed a quartz crystal oscillator controlled by a physics package and associated electronics in an effort to maintain an accurate and stable standard frequency on a long-term basis. The physics package and associated electronics have been used to slave the quartz crystal oscillator to the frequency of the atomic transition thereby reducing the tendency of the quartz crystal to exhibit drifting due to aging and environmental effects.

Such atomic frequency standards have in the past generally been characterized by means to dissociate the atoms, and means to form the dissociated atoms into narrow beams of atoms with a specific energy level, with said beams being contained within vacuum systems to remove gasses that might interfere with the beam of atoms, and also by means using buffer gasses to contain the atoms. Various electrical and thermal components have been associated with the dissociator and the means to provide the atomic beam. While these various components and elements of the prior atomic frequency standards have been necessary to the operation of the frequency standard, they have introduced long-term and short-term instabilities into the frequency standard. For example, buffer gasses have resulted in collisions with the atoms undergoing energy level transition and have created variations in the frequency of the atomic transition and are a source of long-term instability, particularly in rubidium standards. Dissociators, vacuum pumps, beam focusing and atomic separation means and other such components contribute sources of unreliability and increase the size and the weight and the power requirements of atomic frequency standards.

There has been a continuous and extensive effort in the art to develop reliable atomic frequency standards having short-term and long-term stability in their frequency output, and such improved reliability and reduced size, weight and power requirements as to permit their economical use and transportation. The long and continuous effort to develop improved frequency standards is exemplified by U.S. Pat. Nos. 3,397,310, 3,403,349, 3,536,993, 3,577,069, 3,718,868, 3,967,115, 4,059,813, 4,354,108, 4,425,653, 4,596,962, 4,684,900 and 4,814,728.

DISCLOSURE OF THE INVENTION

This invention provides a new detection method and system using the saturated absorption, double resonance of a narrow velocity class of atoms, and new and substantially improved frequency standards and physics packages.

In methods of this invention, an ensemble of atoms, substantially of a single element such as cesium, are provided within a closed cell which is at least partially transparent to laser light. Two laser beams of substantially unvarying and equal frequency are transmitted through the enclosed ensemble of atoms in counter-propagating directions. The frequency of the two laser beams is selected to correspond to the average of two optical frequencies that are selected to change a narrow velocity class of atoms of the ensemble from a first energy level to a second energy level and from the first energy level to a third energy level. These two laser beams cause a change in the population of a fourth energy level. Electromagnetic energy is also generated in the enclosed ensemble of atoms at a frequency to change the same narrow velocity class of atoms from the first energy level to the fourth energy level. By detecting the intensity of light leaving the ensemble of atoms, a signal of variation in the frequency of the electromagnetic energy can be obtained.

This invention provides a cesium, cell-type, optically-pumped frequency standard without the environmental sensitivities and instabilities characteristic of prior standards. Frequency standards of the invention have a high signal-to-noise ratio on detection of the microwave transition and provide good short-term stability. Because the system is free of buffer gas, it is free of a major source of long-term instability found in prior standards. In addition, frequency standards of the invention do not require dissociators, ion pumps, atomic beam sources, beam focusing and separating apparatus, and buffer gasses that have characterized prior standards.

A preferred frequency standard of the invention includes a new physics package comprising a microwave cavity means adapted to contain a closed, transparent cell of cesium atoms and to permit the passage of laser light through the microwave cavity means and the closed transparent cesium cell. In the preferred standard and physics package of the invention, a single laser light source is adapted to provide two laser beams which pass in counter-propagating directions through a cesium cell. The two laser beams are equal in frequency and spatially overlap. The first laser beam raises a narrow velocity class of atoms in the cell from a first energy level to a second energy level. The second laser beam raises the same velocity class of atoms from the first energy level to a third energy level. The frequency of the laser corresponds to the average of the two optical frequencies required to raise an atom of zero velocity, for example, from the first energy level to the second energy level and from the first energy level to the third energy level. The velocity class of atoms which is chosen by this method is related to the energy difference between the second and third energy levels. A frequency generating means is connected with the microwave cavity of the physics package and provides energy to the microwave cavity at a frequency which corresponds to the transition of the narrow velocity class of cesium atoms from the first energy level to a fourth energy level. A light intensity detector detects the intensity of one of the laser beams after leaving the microwave cavity, and its output controls the frequency of the frequency generating means and maintains a constant standard frequency by sensing the energy level transition of the narrow class of cesium atoms. The microwave frequency which produces the minimum intensity of the detected beam corresponds to the center frequency of the transition from the first energy level to the fourth energy level. Since the optical resonance frequency is associated with a saturated absorption transition in the cesium gas cell by a particular velocity class of atoms (that is, a class of atoms having a particular speed and direction), atoms which collide with the walls of the cell, and therefore change velocity, do not contribute to the optical signal which controls the microwave frequency. The frequency standard can be free of such sources of short-term and long-term instability as atomic collisions with buffer gas and walls. Since the frequency standard uses a closed cell, there is no requirement for vacuum pumps and atomic beam sources.

Thus, in frequency standards that include a microwave cavity-forming means, a variable frequency source connected to the microwave cavity and means to control the frequency of the variable frequency source by a transition of atoms between two energy levels, this invention provides an improvement through the use of a closed, transparent cell of cesium atoms, contained within a microwave cavity that is adapted to permit the passage of laser light through the microwave cavity and the cesium atoms, a laser light source providing a first laser beam adapted to raise a narrow velocity class of cesium atoms from a first energy level to a second energy level and a second laser beam adapted for attenuation in passage through cesium atoms at a frequency related to the difference between the first energy level and a third energy level, and a means to provide a microwave frequency locking signal from the intensity of the second laser beam leaving the microwave cavity.

BEST MODE FOR CARRYING OUT THE INVENTION

This invention employs a fundamentally different means of measuring atomic microwave transition which may be referred to as Saturated Absorption Double Resonance. In the invention, an ensemble of atoms, preferably alkali elements, is provided in a closed cell and a narrow velocity class of atoms is optically energized to use the narrow optical resonance (e.g., 5-to-10 MHz at $3.5 \times 10^{14}$ Hz) associated with its saturated absorption transition in detection systems as described below.

Figure 1:
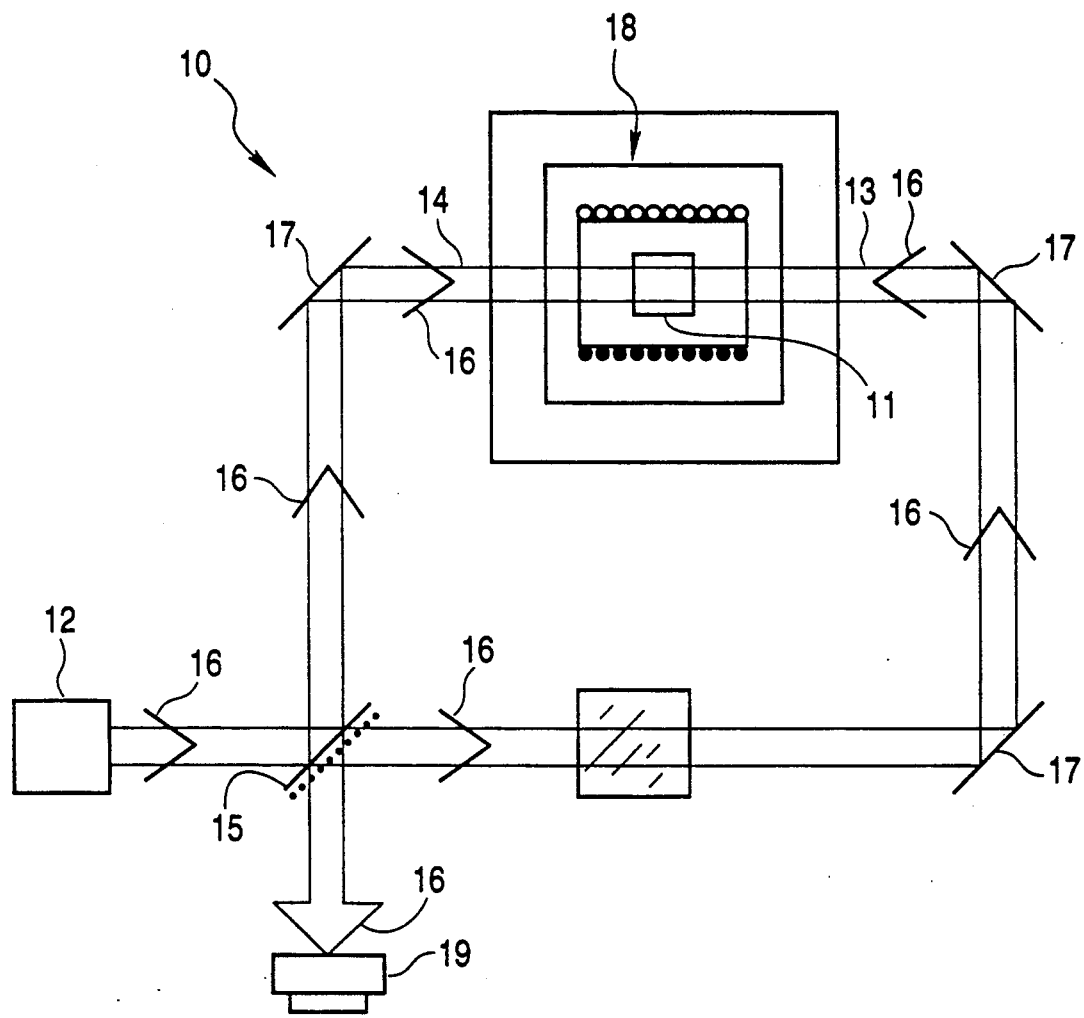
FIG. 1 is a diagrammatic illustration of a system and method of the invention.
Figure 2:
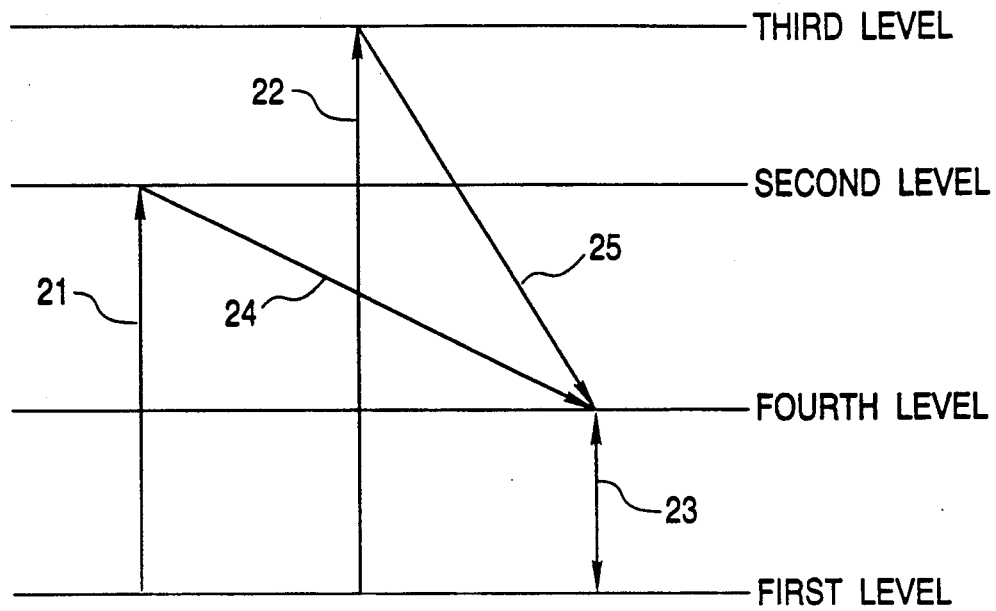
FIG. 2 is an energy level diagram to illustrate operation of the system of FIG. 1.

FIGS. 1 and 2 illustrate a basic system 10 of this invention and its operation. As shown in FIG. 1, an ensemble of atoms is provided in a closed cell 11. Closed cell 11 is at least partially transparent to light. A laser light source 12 provides laser light beam at a substantially unvarying frequency corresponding to the average of two optical frequencies that are selected to change a narrow velocity class of atoms of the ensemble of atoms in the closed cell from a first energy level to a second energy level and from the first energy level to a third energy level. In the system of FIG. 1, the laser light beam is split into two beams 13 and 14, for example, by the partially reflective, partially transmissive element 15. The two beams 13, 14 are directed in FIG. 1 by means comprising a plurality of mirrors 17 so that two beams of substantially unvarying and equal frequency are transmitted through the ensemble of atoms in the closed cell 11 in counter-propagating directions. The directions of beams 13 and 14 are indicated in FIG. 1 by arrows 16. While FIG. 1 shows the two beams transmitted through the cell along parallel paths, the two beams can be directed through the cell in counter-propagating non-parallel and varying paths by the beam directing means 17.

As indicated in FIG. 1, closed cell 11 is contained within a microwave cavity 18 which is adapted to permit the laser light beams to pass through closed cell 11. By using such a microwave cavity, electromagnetic energy can be generated in closed cell 11 and in the ensemble of atoms at a frequency to change the same narrow velocity class of atoms excited by the two laser beams from the first energy level to a fourth energy level. Microwave cavity 18 may be provided with a magnetic shield and a C-field winding, as indicated in FIG. 1 if desired.

As shown in FIG. 2, one laser beam excites the atoms into a transition 21 from a first energy level to a second energy level, the second laser beam excites the atoms into a transition 22 from the first energy level to a third energy level and the microwave energy excites the atoms into a transition 23 from the first energy level to the fourth energy level. Atomic relaxation provides transitions 24 and 25 from the second and third energy levels to the fourth energy level.

The intensity of light leaving the ensemble of atoms provides a signal of the variation of the frequency of the microwave electromagnetic energy. For example, as the frequency of the electromagnetic energy departs from the frequency that causes the transition of the narrow velocity class of atoms to the fourth energy level, the number of the narrow velocity class of atoms available for transition to the second and third energy level changes, resulting in a change in the transitions from the first energy level to the second and third energy levels and a change in the attenuation of the laser light beams. The signal may be provided by collecting the light output of the fluorescing atoms or one of the laser beams. By detecting the intensity of such light, as, for example, by detecting the intensity of one of the laser light beams by a light intensity detector 19 as shown in FIG. 1, the resulting signal can be of beneficial use in frequency standards, communications apparatus, navigation apparatus, chemical analysis apparatus and other apparatus.

For example, with an ensemble of cesium atoms in closed cell 11 of FIG. 1, two beams of light 13, 14 from a tunable diode laser 12, providing light with a wavelength of 852 nm, can be transmitted in counter-propagating directions through the cesium vapor cell 11. The microwave resonator 18 can be tuned to 9.193 GHz. When the laser is tuned to the D2 optical transition in atomic cesium, light is absorbed by the cesium vapor. The photodetector 19 placed behind the beamsplitter 15 can measure this broad (500 MHz wide) resonance. Because the cesium atoms are moving in random directions, each excited state hyperfine resonance is broadened by the Doppler effect. However, there is a decrease in absorption at laser frequencies where the two laser beams interact with the same atoms. This occurs on resonance for atoms in the zero-velocity class, and midway between "crossed" resonances for atoms travelling with velocities which Doppler shift one laser beam into resonance for a transition from a first energy level to a second excited-state hyperfine level, and Doppler shift the counter-propagating laser beam into resonance for a transition from the first energy level to a third excited-state hyperfine level. These dips in absorption occur at the midpoint of the two hyperfine levels, and are most pronounced when one transition is a cycling transition and the other one is a pumping transition.

Figure 3:
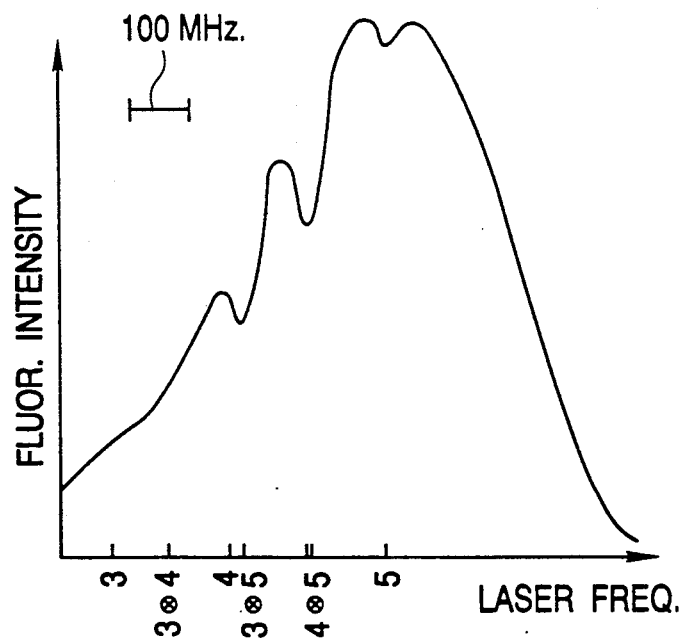
FIG. 3 is a graph of the saturated absorption spectra of cesium atoms, $F=4 \rightarrow F'$, showing fluorescence intensity as a function of increasing laser frequency with a number of saturation absorption resonance frequencies plotted.

FIG. 3 shows the saturated absorption of cesium atoms as a function of laser frequency for the $F=4$ ground state hyperfine line. The specific transitions are labelled on the curves, with the symbol $(x)$ indicating "crossed" transitions. It should be noted that the "crossed" transitions described here are a different phenomena than the "level crossing" transitions considered in traditional magnetic resonance spectroscopy.

If the laser is tuned to one of these saturated absorption transitions, say the $F=4\rightarrow5$ $(x)$ $4\rightarrow3$ transition, and microwaves are applied to the microwave resonator, the level of absorption by cesium will change as the microwave frequency is tuned through the ground state hyperfine level splitting. In particular, when a small dc magnetic C-field is applied parallel to the magnetic field vector of the microwaves, there will be microwave resonances corresponding to each of the seven $F=3$ magnetic sublevels, much as in a traditional cesium beam frequency standard.

Figure 4A:
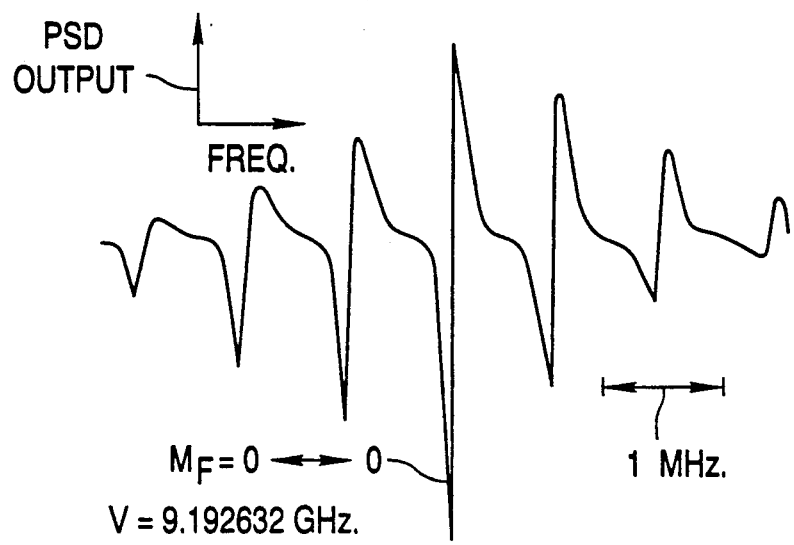
FIG. 4A is a graph of an output of the method of the invention as a function of microwave frequency.
Figure 4B:
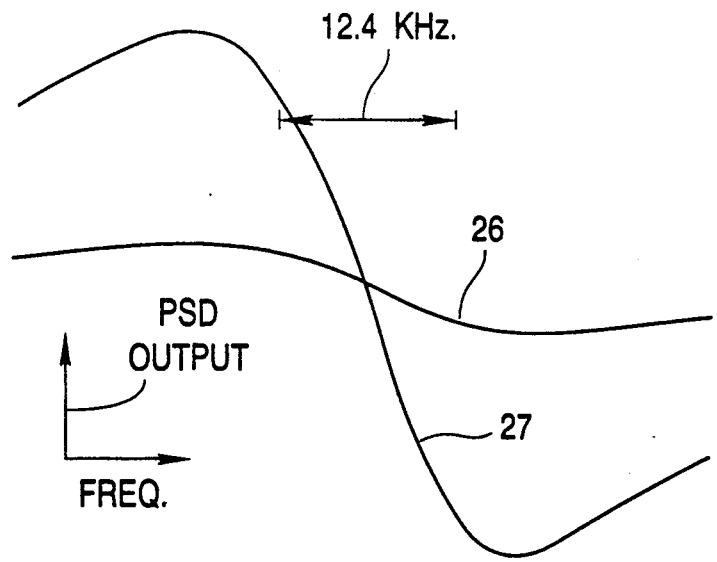
FIG. 4B is another graph of an output of the method of the invention on a greatly expanded scale.

FIG. 4A illustrates experimental results of this invention using cesium. The curve in FIG. 4A is a derivative as a function of the microwave frequency of the absorption as sensed by a phase sensitive detector (PSD) which was used to improve the signal-to-noise ratio. FIG. 4B is a similar measurement of the central microwave resonance ($M_F=0\rightarrow0$). The saturated absorption transition for FIG. 4B is $F=4\rightarrow5$ $(x)$ $4\rightarrow3$. Curve 26 is with a small C-field, and curve 27 is with the C-field set to zero. In the latter case, the magnetic sublevels coalesce into one larger resonance. The central microwave resonance (at 9.192 631 770 GHz) can be used as the frequency reference of a frequency standard.

Thus, the method and apparatus of this invention use laser-light, saturated absorption spectroscopy to select a narrow velocity group of atoms of an element such as cesium contained in a vacuum cell. The atoms are selected in the invention to be those which are travelling predominantly along the laser beam axis. Atoms which travel transversely to the laser beam may contribute to the saturated absorption signal if they have sufficiently high components of velocity along the laser beam axis. However, these atoms will collide with the wall of the cell and change direction of motion. Consequently, they will no longer contribute to the saturated absorption signal, and therefore will not affect the microwave signal. By selecting a Doppler shift which corresponds to a velocity near the peak of the Maxwellian velocity distribution, the number of atoms which contribute useful signal can be optimized.

In this manner, the invention forms essentially an atomic beam within a cell, with no buffer gas and the atoms are continually reused. No oven, getters or ion pump are required.

As described above, there are several possible saturated absorption lines which may be used for a miniature cesium frequency standard (in fact, there are a total of 12 lines). At this time, it is believed that the $F=4\rightarrow5$ e,crc/x/ $4\rightarrow3$ crossed transition is the most appropriate for this application. This is due in part to the large size of the transition, because it is a pumping transition crossed with a cycling transition. It is also displaced in frequency from the region of greatest absorption (which occurs near the $F=4\rightarrow5$ transition), and thus will allow operation of the cell at higher temperatures, which is desirable for a practical device. Additionally, the size of Doppler shift required to reach this transition corresponds to a velocity class which is well populated in the thermal distribution of the cesium vapor. Transitions which originate in the $F=3$ ground state are less desirable because the mechanism of cycling transitions is weakened by the proximity of the $F'=2$ excited state to the $F'=3$ excited state.

Figure 5:
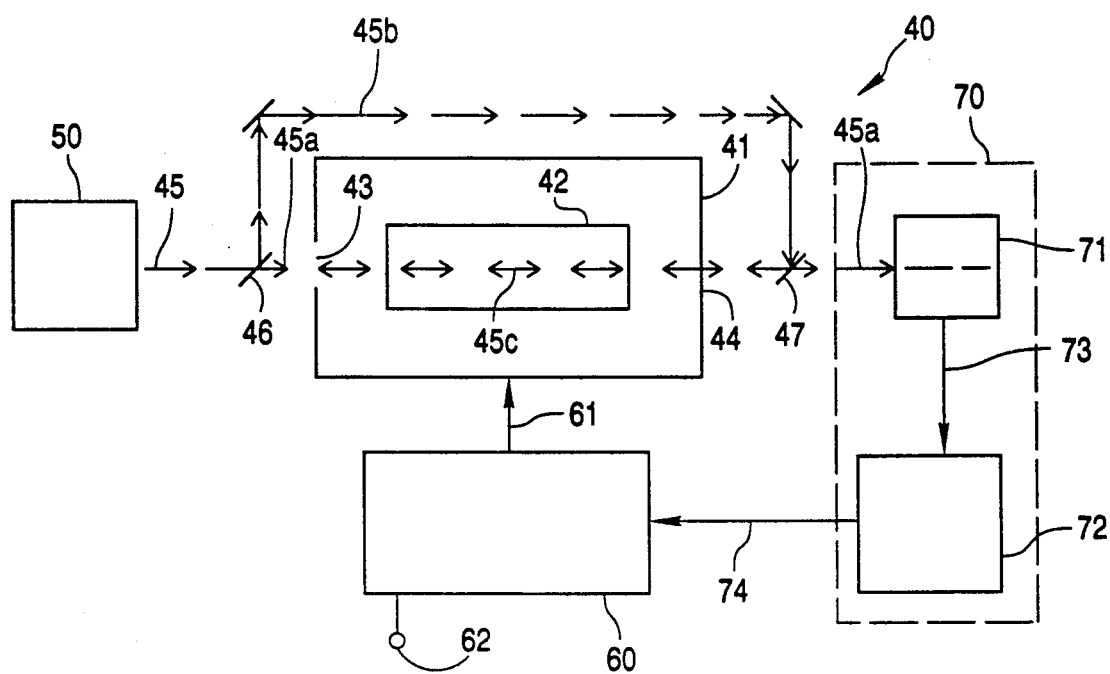
FIG. 5 is a block diagram of a frequency standard of this invention.

FIG. 5 is a block diagram of a frequency standard 40 of this invention. As shown in FIG. 5, the frequency standard 40 includes a microwave cavity means 41 adapted to contain a closed cell 42 of cesium atoms that is at least partially transparent to laser light. The microwave cavity 41 may be adapted with one or more openings to permit the passage of laser light through the microwave cavity 41 and the closed transparent cell 42 of cesium atoms. As shown in FIG. 5, microwave cavity means 41 is provided with a first opening 43 and a second opening 44 for the laser light 45, which is indicated by the dashed arrowed lines. However, microwave cavity means 41 may be provided with a single opening for laser light as explained below and shown in FIG. 6.

As shown in FIG. 5, a laser light source 50 provides a laser light beam 45. Laser light beam 45 is split into two beams 45a and 45b by a beam splitter 46. The first laser beam 45a is adapted to raise a selected velocity class of cesium atoms in cesium cell 42 from a first energy level to a second energy level, and the second laser beam 45b is adapted to raise the same velocity class of cesium atoms from a first energy level to a third energy level. (See FIG. 2.) As further shown in FIG. 5, the second laser beam 45b is directed, by a second partially reflective, partially transmittive element 47, through the cesium cell 42 in the opposite direction to the first beam 45a. The counter-propagating directions of beams 45a and 45b are indicated in FIG. 5 by the double-headed dashed lines 45c. The selected narrow velocity class of atoms has a particular speed and direction, and the frequency standard 40 is thus adapted to direct the first and second laser beams through the atomic vapor in counter-propagating directions to raise the narrow velocity class of atoms to the second and third energy levels. The closed cell 42 preferably contains cesium vapor, and the microwave cavity means 41 forms an internal chamber with electrically conductive walls that are so dimensioned as to form a microwave cavity that resonates, for example, in the $TE_{011}$ mode, at the transition frequency of the selected velocity class of cesium atoms between a first level and a fourth level. (See FIG. 2.) It is the frequency of resonance between the first and fourth levels that serves as the stable reference for the frequency standard. The second and third levels are used as a means of (a) velocity selection; (b) state preparation; and (c) state detection. Cesium cell 42 contains only cesium atoms and contains no buffer gas.

A frequency generating means 60 is connected with the microwave cavity means 41 and provides energy to the microwave cavity at a frequency which corresponds to the transition of the narrow velocity class of cesium atoms from the first energy level to the fourth energy level, e.g., 9.192631770 GHz. As indicated below, frequency generating means 60 includes a variable frequency oscillator and frequency converters to provide a first frequency output 61 at the transition frequency of the narrow velocity class of cesium atoms and a second frequency output 62 at a selected standard frequency.

The frequency standard 40 is also provided with means 70 for detecting the intensity of the first laser beam and for controlling the frequency generating means 60 to maintain a constant frequency with the sensed, optical transition frequency of the narrow velocity class of cesium atoms. As shown in FIG. 5, the means 70 may include a laser light sensor 71 adapted to detect only one of the beams from laser light source 50 and a frequency locking circuit means 72 connected with the laser light sensor 71 and with the frequency generating means 60 and adapted to use the signal 73 from laser light signal sensor 71 to control the frequency generating means 60 to control and maintain the standard frequency at output 62 by sensing the intensity of the first laser beam 45a. Variation of the output frequency 61 of the frequency generating means 60 will vary the number of cesium atoms at the first energy level and will produce varied attenuation of first laser beam 45a in its passage through cesium cell 12. As the microwave frequency of frequency generating means 60 departs from the narrow transition frequency of the selected velocity class of cesium atoms, a change in the absorption of laser light occurs in the cesium cell, and the change in intensity of the first laser beam 45a will be sensed by the laser light sensor 71. The resulting signal 73 will be interpreted by the frequency locking circuitry 72 to provide a frequency locking signal 74 which will correct for deviations in the frequency generating means 60 to maintain the first output 61 at the microwave resonant frequency that is associated with the separation of the first and the fourth energy levels of the selected velocity class of atoms and to maintain the second output 62 at the standard frequency. The microwave resonance is on the order of 1-10 kHz wide at the transition frequency of 9.193 GHz.

The dimensions of the cesium cell may be varied. However, it is believed that a cesium cell having a length of about 3 cm and a diameter of about 1 cm will provide good results with a single passage of the laser beam 45a through the cesium cell.

Figure 6:
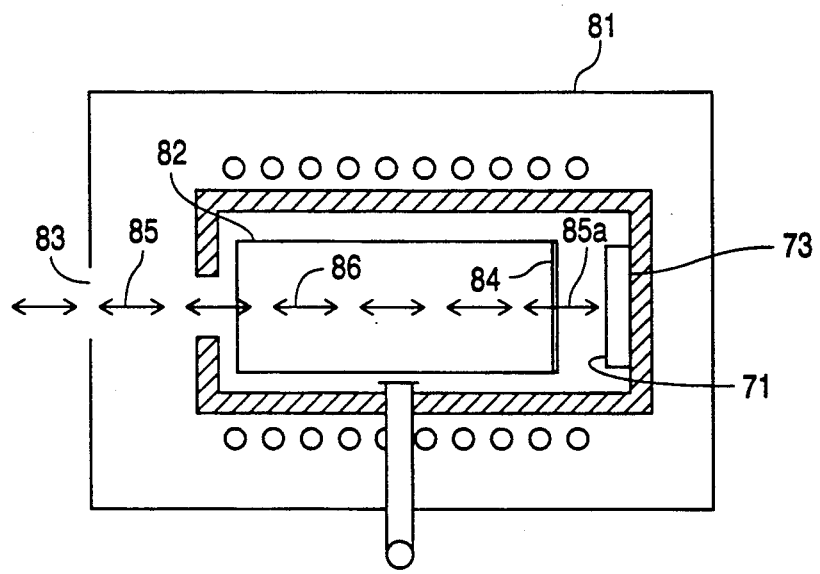
FIG. 6 is a diagrammatic drawing of another microwave cavity embodiment for a frequency standard of this invention.

Instead of splitting the laser beam into two beams before entering the cell, the frequency standard of the invention may be provided with other means for directing the laser light beam through the cesium cell in counter-propagating directions. Such an alternative means is shown in FIG. 6. The microwave cavity forming means 81 shown in FIG. 6 may be used in place of the microwave cavity forming means 41 shown in FIG. 5 in a frequency standard that is otherwise identical. The microwave cavity forming means 81 of FIG. 6 is provided with a single opening 83 for the passage of laser light. The laser beam 85 enters the microwave cavity forming means 82 through opening 83 and passes through cesium cell 82. A retro-reflector 84 is provided at the end of the cesium cell 82. The laser beam 85 is reflected by a partially reflective, partially transmissive mirror, or retro-reflector, 84 that is manufactured from a material not affecting the "electrical dimensions" of the microwave cavity. The reflected laser beam serves as a second laser beam, as indicated by the dashed, double-arrowed lines 86. The portion 85a of the laser light beam 85 passing through mirror 84 activates light intensity sensor 71, which produces the signal 73 for use in the frequency standard, as shown in FIG. 5 and described above.

In another embodiment, mirror 84 can be totally reflective, and upon exiting microwave cavity forming means 81, the reflected portion of beam 85 can be intercepted and directed to laser light sensor 71 which provides the signal 73 in the same manner as set forth above. If desirable, a partially reflective, partially transmissive beam directing means may be provided to intercept the reflected portion of laser beam after it leaves the microwave cavity forming means 81 to direct the reflected portion of the laser light beam to a convenient location of the laser light intensity sensor 71.

Figure 7:
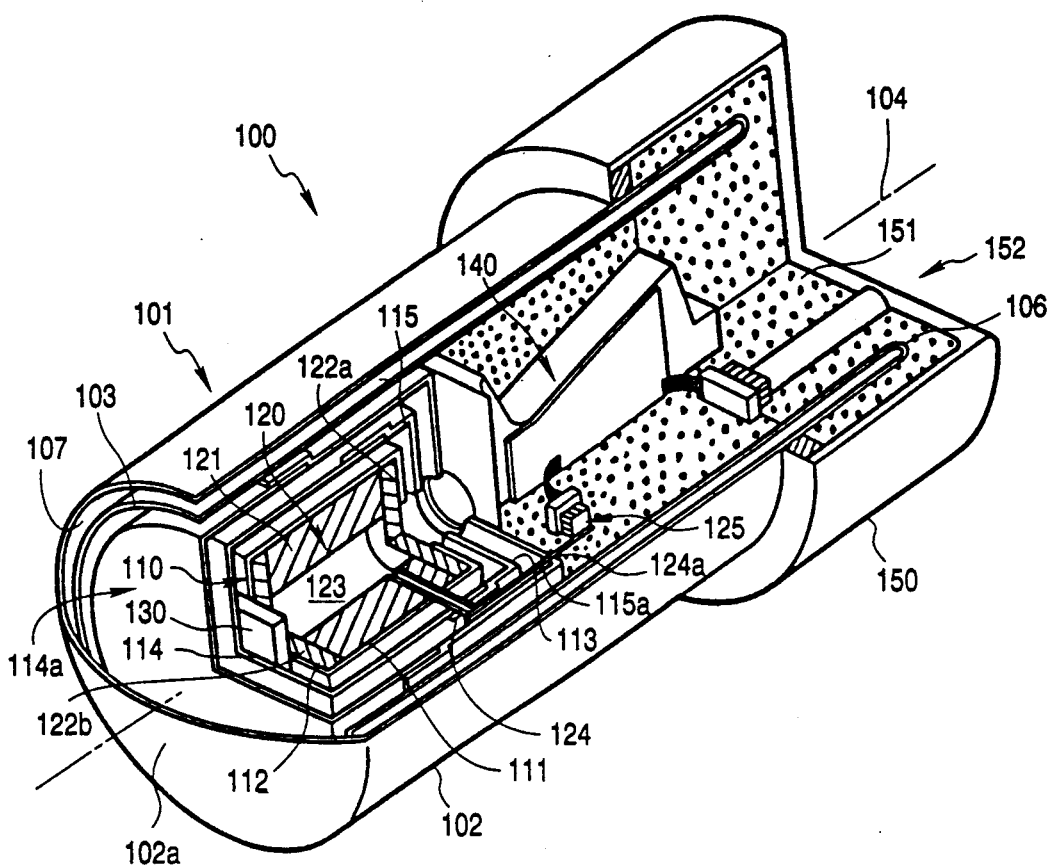
FIG. 7 is a cut-away perspective drawing of a physics package of this invention.

FIG. 7 illustrates a physics package 100 for a frequency standard of this invention.

The physics package 100 comprises a vacuum insulated container portion 101 having a cylindrical outer wall 102 and closed end 102a and a cylindrical inner wall 103 and closed end (not shown) which is broken away in FIG. 7 to show the interior parts of the package. The cylindrical inner and outer walls share a common central axis 104. The cylindrical outer wall 102 and cylindrical inner wall 103 are sealed at their open ends, as shown at 106, to form an intervening space 107 adapted for evacuation.

A microwave cavity forming means 110 is carried within the cylindrical inner wall 103 adjacent its closed end. The microwave cavity forming means 110 forms a microwave cavity having a cylindrical sidewall 111 with a closed end 112 adjacent the closed end of the vacuum insulated container and a partially open opposite end 113. The microwave cavity formed by microwave cavity forming means 110 is adapted to provide a $TE_{011}$ resonant mode with a magnetic field vector parallel to the central axis 104 when it is excited, as set forth below.

Magnetic shielding means 114 and 114a encompass the microwave cavity forming means 110 within the container portion 101. The magnetic shielding means 114, 114a have openings at the ends 115 and 115a adjacent the partially open opposite end 113 of the microwave cavity forming means 110.

The microwave cavity forming means 110 contains the means 120 forming a closed, gas-containing cell. Closed cell forming means 120 is comprised of a cylindrical quartz side wall 121 and first and second vitreous glass end walls 122a and 122b that are sealed with quartz side wall 121. The vitreous glass ends are formed with a glass having low dielectric losses, such as Corning No. 7940. The resulting enclosed cell 123 is located within the microwave cavity forming means 110 with the cylindrical quartz side wall 121 concentrically surrounding the central axis 104 and providing dielectric loading of the microwave cavity. The first vitreous glass end wall 122a is located adjacent the partially open wall 113 of the microwave cavity forming means 110. The second vitreous glass end wall 122b is located adjacent the closed end 112 of the microwave cavity forming means 110 and is provided with a partially reflective coating. The closed cell forming means 120 is thus adapted to contain an ensemble of substantially pure gas atoms, preferably cesium atoms, in the closed cell 123.

A light intensity sensor 130 is located immediately adjacent the second vitreous glass end wall 122b of the closed cell to sense light passing through the second end wall 122b of the closed cell.

A solenoid coil within the microwave cavity (not shown) surrounds the closed cell 123 and is wound to provide a direct current C-field with its magnetic vector parallel to the central axis 104.

An input microwave coupling probe (not shown) is used to excite the $TE_{011}$ resonance and enters the side of the microwave cavity 110 in a manner well known in the art.

A laser diode light source 140 is located within the inner container wall 103 immediately adjacent the partially open end 113 of the microwave cavity forming means 110, and mechanically attached to the outer magnetic shield 114a.

The laser diode light source 140 generates a beam of laser light directed through the partially open end 113 of the microwave cavity forming means 110, the open ends 115 and 115a of the magnetic shields 114 and 114a, the first vitreous glass end wall 122a of the closed cell forming means 120 and the ensemble of atoms in closed cell 123. A first portion of said laser light beam is reflected back through the ensemble of atoms by the partially reflective coating of said second end wall 122b of the closed cell forming means 120, and a second portion of said laser light beam passes through the second end wall 122a of the closed cell, activating the light intensity sensor 130.

The frequency of the laser light beam is selected to correspond to the average of two optical frequencies selected to change a narrow velocity class of atoms from a first energy level to a second energy level and to a third energy level. The microwave cavity is excited by a frequency selected to change the same narrow velocity class of atoms from the first energy level to a fourth energy level and excite the cavity in the $TE_{011}$ mode as set forth above.

To control the vapor pressure of the ensemble of atoms, the side wall 121 of means 120 forming the closed cell 123 is preferably formed with a hollow quartz side arm 124 open to the closed cell 123 and extending outwardly from side wall 121. The side arm can be provided at its end remote from closed cell 123 with a drop of the liquified gas, for example, a drop of cesium. The interior of container 101 can be provided with a means 125 (such as a thermoelectric cooler), in heat transfer relationship with the outer end of cell side arm 124, as for example by metallic interconnection 125a, to control the temperature of the outer end of side arm 124 and thereby control the vapor pressure of the atoms of gas within closed cell 123. The side arm of quartz tubing can be attached using a glass frit sealant. By separately cooling a small volume of the side arm to about 25° C., the vapor pressure of cesium in the cell can be controlled and still allow the temperature of the rest of the cell to rise to the nominal operating temperature of 55° C. This approach will also keep metallic cesium out of the microwave resonator, where it would interfere with the cavity modes.

Without dielectric loading, this microwave cavity would have dimensions of 3 cm long by 4.73 cm diameter. Using quartz as the dielectric material (which has a fairly high dielectric constant of 3.8, and low losses), the diameter of a 3 cm long resonator is reduced to about 2.6 cm. Somewhat greater reduction in diameter is possible by using alumina (dielectric constant of 9.5), but the advantage is small and would present difficulties in fabricating the closed cell.

By using quartz as the dielectric material, the functions of cesium cell and the microwave cavity are combined. The use of windows of a vitreous glass (bonded with a glass "frit", temperature of 450° C.) can result in a minimum of distortion of the windows and yet allow a high temperature bakeout of the closed cell before filling with atoms.

A notch can be cut into the side wall of the quartz cylinder. The input microwave probe consists of a loop which extends into this notch for good coupling into the microwave resonator. The outside wall of the resonator can consist of a metallized layer of copper on the quartz cylinder.

Figure 8:
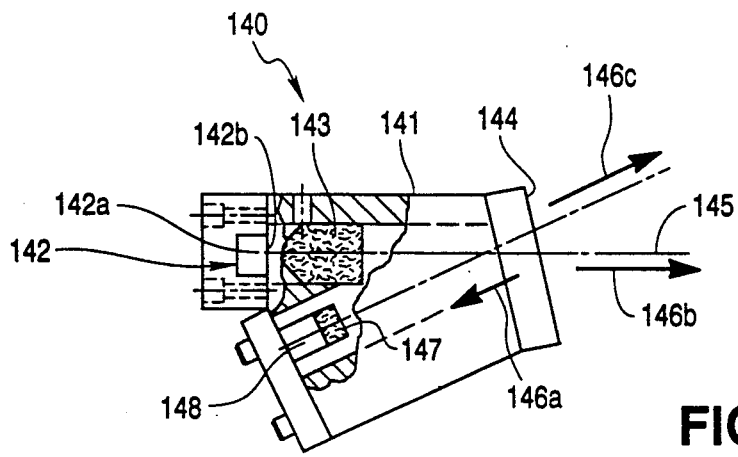
FIG. 8 is a partially cut-away drawing of a laser source of a physics package of this invention.

Laser assembly 140 is shown in greater detail in FIG. 8. Laser assembly 140 uses a folded Littrow configuration of external cavity. Laser assembly 140 is adapted to transmit through end wall 122a of the closed cell, a substantially unvarying beam of laser light at a frequency corresponding to the average of the two optical frequencies, preferably to provide F=4→5 $\otimes$ 4→3 crossed transitions of a narrow velocity class of cesium atoms within the closed cell 123.

The laser assembly 140 comprises a laser cavity forming means 141 including a laser diode 142 having a non-transmitting back surface 142a provided with a gold coating and a transmitting surface 142b provided with an anti-reflective coating.

A lens 143 produces the laser beam from the laser light emitted through the transmitting surface 142b of the laser diode 142.

A partial reflector 144 is arranged at an angle to the central axis 145 of the beam of light from lens 143 so that a first portion of the beam of light 146a is reflected at an angle generally toward a diffraction grating 147 and the remaining portion of the beam of light 146b is transmitted through the partial reflector, generally parallel to the central axis of the beam of light from said lens.

A diffraction grating 147 is supported to receive the first portion 146a of the beam and to reflect light at the frequency corresponding to the average of the two optical frequencies to provide F=4→5 (x) 4→3 crossed transitions of the cesium atoms back to said partial reflector 144 and into laser diode 142. A portion 146c of the first portion passes through the partial reflector 144 and is directed through the end wall 122a of closed cell 123 and through the ensemble of atoms therein.

A piezoelectric transducer 148 supports diffraction grating 147 and provides adjustment of the effective length of the laser cavity.

In this folded Littrow design, a commercially manufactured laser diode can be modified by gold coating the back facet and placing an anti-reflection (AR) coating on the front facet. Light emitted by the laser is collimated, passes to a partially reflective output mirror and reflected to a 1200 l/mm diffraction grating. Light at the proper wavelength is reflected back on itself to the laser diode, producing a second output beam in the process. The angle of the diffraction grating with respect to the laser beam axis determines the coarse wavelength of the laser, and successfully discriminates against unwanted longitudinal laser modes associated with the laser chip (free spectral range, FSR=150 GHz). A piezoelectric transducer (PZT) can provide control of the external cavity length, which allows tuning over the FSR of 2.5 GHz. Additional fine tuning and rapid frequency modulation of the laser is possible through modulation of the laser injection current.

Measurements with a 0.5 m monochromator demonstrate that the output from this device can be highly single mode, with no evidence of other longitudinal cavity modes to −38.7 dBc. By beating the outputs of two such lasers, it has been determine that the 3-dB linewidth of the pair is about 1 MHz, which is favorable compared with the 5-MHz natural linewidth of the cesium D2 optical resonance.

When such a laser is used to detect cesium atoms in an atomic beam, the measured SNR was $1.8 \times 10^{10}$/Hz. This value of SNR is satisfactory for miniature cesium standard designs.

As shown in FIG. 7, the container 101 of physics package 101 of physics package 100 is closed by a lid 150 attached to the outer wall 102 of the container and the end of the container 101 adjacent the lid can be provided with thermal insulation 151, such as insulating foam. Connectors for operation of the physics package 100 can extend through the lid 150 (not shown), and thermal heat transfer, or "heat sinking", for the thermoelectric coolers can be made to the lid 150, as indicated at 152.

The invention thus provides a fundamentally different means of measuring the microwave transition in atomic cesium. This new method differs from traditional cesium beam frequency standards in that it uses a closed cell, which does not require a vacuum pump or cesium beam oven. It differs from rubidium frequency standards in that the cell contains only cesium, with no buffer gas, and that the atoms which contribute to the microwave signal are selected by velocity class with a Saturated Absorption Double Resonance method.

Using Saturated Absorption Double Resonance, a narrow optical resonance (5 to 10 MHz wide at $3.5 \times 10^{14}$ Hz) associated with a saturated absorption transition in a cesium cell may be used to select a particular velocity class of atoms within the cell. By applying microwaves to the atoms, the number of atoms undergoing saturated absorption resonance changes, allowing the determination of the frequency of the microwave resonance to great accuracy. Since the number density of atoms in a vapor is high relative to that in a beam, a fairly small volume of atoms can produce a high signal-to-noise (SNR) on detection of the microwave resonance. Additionally, since a closed cell obviates the need for a vacuum pump or atomic beam source, the power requirements and failure mechanisms associated with those components are eliminated. Other attempts have been made to use an effective beam in a closed cell. For example, see M. Feldman, et al., "Preliminary Investigation of a New Optically Pumped Atomic Rubidium Standard", Proc. 35th Ann. Freq. Control Symposium, May, 1981, p. 625. These studies were fundamentally different than this invention, which uses saturated absorption techniques to improve the signal-to-noise ratio on detection of the microwave resonance.

Frequency standards of this invention can have frequency stabilities comparable to Rb frequency standard in benign environments, but have an order of magnitude smaller sensitivity than a Rb standard to temperature, pressure and humidity changes. Frequency standards of the invention can operate over an extended temperature range and under vibration. The physics package can be small enough to be used in a 1 liter instrument and the electronics can be designed for low power operation.

The invention can thus provide a low power, miniature atomic frequency standard that makes improved timekeeping performance available to more systems. Cesium beam timekeeping performance, currently used principally in strategic applications because of size, weight, power and cost considerations, can be available in the tactical theater, making possible tighter timing tolerances in communications systems, better navigation and longer missions. Cost reductions are possible in certain strategic systems not requiring the ultimate in long-term timekeeping performance. Not only are initial acquisition costs reduced, but also the ongoing beam-tube replacement costs can be reduced. Existing Cs beam tubes (one-half the cost of the Cs frequency standard) have had limited lifetimes due to both the finite Cs supply and contamination of the detector by expended Cs. These technical difficulties are exacerbated in a miniature device. The only miniature Cs beam tube developed to date (used in the HP 5062A) had a lifetime of approximately 18 months and was as large as the entire atomic frequency standard of this invention including the electronics. Both of these lifetime limitation mechanisms are eliminated by the closed cell design of the invention.

EXAMPLE

| Miniature Cesium Frequency Standard | |
|---|---|
| Size | 1000 cm$^3$ |
| Power Consumption | 15 W |
| Weight | 3 lbs (1.4 kg) |
| Temperature Sensitivity | $<3 \times 10^{-11}$, −55° C. to +80° C. |
| Pressure Sensitivity | $<4 \times 10^{-12}$, sea level to 10 km |
| Warmup Time | <4 min. at −55° C. ambient |
| Life | 10 years |
| Short Term Stability | $\sigma y(\tau) \, 1 \times 10^{-11} \tau^{-1/2}$, for $\tau > 1_s$ |
| Long Term Stability | $5 \times 10^{-12}$ |
| Lifetime Accuracy | $5 \times 10^{-11}$ |
| Tuning Resolution | $1 \times 10^{-12}$ |

While I have described what I believe to be the most preferred present embodiments, my invention can take many forms. Accordingly, it should be understood that the invention is to be limited only insofar as required by the following claims and the prior art.

I claim:

1. A method of using the optical absorption of a narrow velocity class of atoms in a detection system, comprising:

providing an ensemble of atoms of a substantially single element in a closed cell which is at least partially transparent to laser light;

transmitting two beams of laser light of substantially unvarying and equal frequency through the ensemble of atoms in counter-propagating directions, the frequency of each of said laser light beams corresponding to the average of two optical frequencies selected to change a narrow velocity class of atoms of said ensemble from a first energy level to a second energy level and from the first energy level to a third energy level;

generating electromagnetic energy in the closed cell and ensemble of atoms at a frequency to change the narrow velocity class of atoms from the first energy level to a fourth energy level; and detecting the intensity of light leaving the ensemble of atoms as a signal of the variation of the frequency of the electromagnetic energy.

2. The method of claim 1 wherein the ensemble of atoms comprise cesium atoms.

3. The method of claim 2 wherein said closed cell is contained within a microwave resonator tuned to about 9.193 GHz and excited to generate electromagnetic energy in said closed cell at a frequency of about 9.193 GHz.

4. The method of claim 1 wherein the frequency of said laser light beam is selected to correspond to the change in the energy level of the zero velocity class atoms of said ensemble.

5. The method of claim 1 wherein the frequency of said laser light beams is selected to provide crossed resonances for said narrow velocity class of atoms, with one portion of the narrow velocity class of atoms changing in a cycling transition and the other portion of the narrow velocity class of atoms changing in a pumping transition.

6. The method of claim 1 wherein a small direct current magnetic field is generated through the closed cell and ensemble of atoms.

7. The method of claim 6 wherein the vectors of the small direct current magnetic field and the magnetic field of the electromagnetic energy are substantially parallel.

8. The method of claim 2 wherein the frequency of the laser light beams is selected to provide $F=4\rightarrow 5$ (x) $4\rightarrow 3$ cross transitions of said narrow velocity class of cesium atoms.

9. The method of claim 1 wherein said signal resulting from the detection of the intensity of one of said laser beams is used to control and stabilize the frequency of said electromagnetic energy generated in the closed cell and ensemble of atoms and to provide a standard frequency.

10. The method of claim 1 wherein said atoms are selected from one of the group of alkali elements.

11. The method of claim 1 wherein the intensity of the light leaving the ensemble of atoms is the intensity of one of said laser light beams.

12. The method of claim 1 wherein the ensemble of atoms fluoresce in response to the laser light beams and the intensity of the light leaving the ensemble of atoms is the intensity of the fluorescent light from the ensemble of atoms.

13. The method of claim 1 wherein the counter-propagating directions of the two beams of laser light are not parallel.

14. The method of claim 13 wherein the relative counter-propagating directions of the two beams of laser light are varied with respect to each other.

15. The method of claim 1 wherein the two beams of laser light are transmitted from a single laser light source.

16. A frequency standard, comprising:

a microwave cavity means adapted to contain a closed, at least partially transparent, cell of cesium atoms, and to permit the passage of laser light through the closed, at least partially transparent cell of cesium atoms;

a laser light source adapted to provide a substantially unvarying laser light beam at a selected frequency;

means adapted to direct said laser light beam into said microwave cavity means and through said closed, at least partially transparent, cell of cesium atoms in counter-propagating directions, the frequency of the laser light beam being selected to raise a narrow velocity class of cesium atoms from a first energy level to a second energy level when travelling through the cesium atoms in one counter-propagating direction and to raise said narrow velocity class of cesium atoms from the first energy level to a third energy level when travelling through the cesium atoms in the other counter-propagating direction;

a frequency generating means connected with said microwave cavity and providing electromagnetic energy at a microwave transition frequency adapted to raise the narrow class of atoms from the first energy level to a fourth energy level; and means to detect the intensity of the laser light beam travelling in one of the counter-propagating directions and to control said frequency generating means to maintain a constant frequency at the microwave transition frequency corresponding to the separation of the first and fourth energy levels of the narrow velocity class of cesium atoms.

17. The frequency standard of claim 16 wherein said microwave cavity means is adapted with at least one opening to permit transmission of the laser light beam through the microwave cavity and the closed cesium cell in a straight line.

18. The frequency standard of claim 16 wherein said microwave cavity consists essentially of a conductive chamber having internal dimensions that are resonant at said microwave transition frequency for the narrow velocity class of cesium atoms and that contain the closed cesium cell, said means adapted to direct said laser light beam into the microwave cavity and through the closed cesium cell in counter-propagating directions comprises means to split the laser light beam into first and second laser beams and to direct the first and second laser beams into the microwave cavity and through the closed cesium cell in opposite directions, and said conductive chamber is provided with two openings to permit passage of said first and second laser beams through said cesium cell in opposing counter-propagating directions.

19. The frequency standard of claim 16 wherein said microwave cavity is adapted for resonance in the $TE_{011}$ mode at said microwave transition frequency.

20. The frequency standard of claim 16 wherein said means adapted to direct said laser light beam into the microwave cavity and through the closed cesium cell in counter-propagating directions comprises a retro-reflector for said laser light beam positioned to reflect at least a portion of the laser light beam passing through the closed cell of cesium atoms back through the closed cell of cesium atoms in the opposite direction.

21. A frequency standard, comprising:
a closed, at least partially transparent cell adapted to contain cesium vapor;
a microwave cavity assembly having at least one opening for the transmission of laser light, being adapted to contain said cesium cell, and being further adapted to permit laser light to pass through said at least one opening and through said cesium cell;
a laser light source adapted to provide a laser beam at a frequency capable of raising a narrow velocity class of cesium atoms in said cesium cell from a first energy level to a second energy level when propagated in a first direction and capable of raising the same velocity class of atoms from the first energy level to a third energy level when propagated in a second counter-propagating direction;
means for directing said laser light beam to travel through said at least one opening in said microwave cavity and through said cesium cell in the first and second counter-propagating directions;
a laser light intensity sensor adapted and positioned to detect the intensity of said laser beam after travelling through said cesium cell;
a voltage controlled crystal oscillator;
a frequency multiplier having an input connected with said voltage controlled crystal oscillator and an output connected with said microwave cavity, said frequency multiplier and said microwave cavity interacting to excite the microwave cavity and vary the number of cesium atoms at the first energy level; and
a frequency locking circuit connected with said laser light intensity sensor and said voltage controlled crystal oscillator,
said frequency locking circuit and laser light intensity sensor being adapted to lock the frequency of the voltage controlled crystal oscillator with a microwave transition frequency corresponding to the transition of the narrow velocity class of cesium atoms from the first energy level to a fourth energy level.

22. In a frequency standard including a microwave cavity forming means, a variable frequency source connected to said microwave cavity forming means, and means to control the frequency of said variable frequency source by the transition of atoms from one energy level to another energy level, the improvement wherein said microwave cavity-forming means contains a closed, at least partially transparent cell and an ensemble of atoms, and is adapted to permit passage of laser light into said microwave cavity and through said ensemble of atoms, wherein a laser light source provides a laser light beam at a frequency adapted to raise a narrow velocity class of atoms from a first energy level to a second energy level when travelling through the atoms in one direction and to raise the narrow velocity class of atoms from the first to a third energy level when travelling through the atoms in a different direction, wherein means are provided for directing the laser light beam to travel through the closed, at least partially transparent cell in said one direction and said different direction, and wherein said means to control the frequency of said variable frequency source comprises means to provide a frequency locking signal from the intensity of at least a portion of the laser light beam after travelling through the closed, at least partially transparent cell.

23. The frequency standard of claim 22 wherein a beam splitter is provided to split the laser light beam into a first laser beam and a second laser beam, said microwave cavity is adapted with two openings to permit transmission of the laser light beams through the microwave cavity and the closed cell in a straight line and counter-propagating directions, and said laser light beam directing means directs said first laser beam and said second laser beam through the two openings and the closed cell in opposing counter-propagating directions.

24. The frequency standard of claim 22 wherein said microwave cavity consists essentially of a conductive chamber having internal dimensions that are resonant at a transition frequency of said narrow velocity class of cesium atoms from said first level to said fourth level and contains the closed cell.

25. The frequency standard of claim 22 wherein said microwave cavity forming means is provided with one opening for the laser light beam and said beam directing means comprises a retro-reflector at one end of the closed cell to reflect said laser light beam through said cesium cell in said different direction.

26. The frequency standard of claim 25 wherein said retro-reflector is partially transmissive and a light intensity detector is positioned to receive a portion of the laser light beam transmitted through said retro-reflector.

27. The frequency standard of claim 24 wherein said microwave cavity is adapted for resonance in the $TE_{011}$ mode.

28. The frequency standard of claim 21 wherein said microwave cavity is adapted for resonance in the $TE_{011}$ mode.

29. The frequency standard of claim 21 wherein said microwave cavity is provided with openings to permit the directing of the laser light beam through the microwave cavity and the closed cesium cell in a straight line.

30. The frequency standard of claim 21 wherein said microwave cavity consists essentially of a conductive chamber having internal dimensions that resonate at a microwave transition frequency for said narrow velocity class of cesium atoms and contains the closed cesium cell, said conductive chamber being provided with at least one opening to permit passage of said laser light beam through said cesium cell, and a coil for production of a C-field wrapped around said conductive chamber.

31. The frequency standard of claim 21 further comprising a frequency synthesizer to provide a standard frequency output.

32. The frequency standard of claim 21 wherein said microwave cavity forming means is provided with one opening for the laser light beam and said beam directing means comprises a retro-reflector for said laser light beam at one end of the closed cell to reflect the laser light beam through the cesium atoms in a counter-propagating direction.

33. A method of using the microwave resonance of a plurality of narrow velocity classes of atoms in a detection system, comprising:

providing an ensemble of atoms of a substantially single element in a closed cell which is at least partially transparent to laser light;

transmitting a first laser light beam and a second laser light beam through the ensemble of atoms in two counter-propagating directions, said first and second laser light beams being at a substantially unvarying frequency selected to change a narrow velocity class of atoms from a first energy level to a second energy level in one counter-propagating direction and to change the narrow velocity class of atoms from the first energy level to a third energy level in the other counter-propagating direction;

generating electromagnetic energy in the closed cell and ensemble of atoms at a frequency to raise one of the narrow velocity classes of atoms from the first energy level to a fourth energy level;

detecting the intensities of one of the first and second beams of laser light leaving the ensemble of atoms as a signal of the variation of the frequency of the electromagnetic energy; and processing the signals to improve the signal-to-noise ratio.

* * * * *